(12) United States Patent
Chen et al.

(10) Patent No.: US 11,781,555 B2
(45) Date of Patent: Oct. 10, 2023

(54) FAN GUARD CONFIGURED TO SELECTIVELY COVER APERTURE

(71) Applicant: Quanta Computer Inc., Taoyuan (TW)

(72) Inventors: Chao-Jung Chen, Taoyuan (TW); Chih-Hsiang Lee, Taoyuan (TW); Wei-Pin Chen, Taoyuan (TW); Yu-Syuan Lin, Taoyuan (TW); Jyue Hou, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 29 days.

(21) Appl. No.: 17/563,285

(22) Filed: Dec. 28, 2021

(65) Prior Publication Data

US 2023/0204041 A1 Jun. 29, 2023

(51) Int. Cl.
*F04D 25/14* (2006.01)
*H05K 7/20* (2006.01)
*F04D 29/70* (2006.01)

(52) U.S. Cl.
CPC ........... *F04D 25/14* (2013.01); *F04D 29/703* (2013.01); *H05K 7/20172* (2013.01)

(58) Field of Classification Search
CPC .... F04D 25/14; F04D 29/703; H05K 7/20172
See application file for complete search history.

(56) References Cited

U.S. PATENT DOCUMENTS

| | | | | |
|---|---|---|---|---|
| 3,334,569 A | * | 8/1967 | Lambie | F24F 13/142 454/352 |
| 5,904,411 A | * | 5/1999 | Hayakawa | E05F 1/1058 49/386 |
| 6,005,770 A | * | 12/1999 | Schmitt | G06F 1/20 361/679.48 |
| 6,031,717 A | * | 2/2000 | Baddour | G06F 1/20 361/679.48 |
| 6,042,348 A | * | 3/2000 | Aakalu | H05K 7/2019 417/427 |
| 6,181,557 B1 | * | 1/2001 | Gatti | H05K 7/20618 361/679.48 |
| 6,688,965 B1 | * | 2/2004 | Crippen | H05K 7/20718 361/695 |
| 6,710,240 B1 | * | 3/2004 | Chen | H05K 7/20145 361/679.48 |

(Continued)

FOREIGN PATENT DOCUMENTS

| | | | | |
|---|---|---|---|---|
| DE | 102007037230 A1 | * | 3/2008 | ......... F04D 25/0613 |
| EP | 2897448 B1 | * | 2/2017 | ........... F04D 19/002 |

*Primary Examiner* — David E Sosnowski
*Assistant Examiner* — Theodore C Ribadeneyra
(74) *Attorney, Agent, or Firm* — NIXON PEABODY LLP

(57) ABSTRACT

A fan system and a computing system with the fan system are disclosed. The fan system includes a fan module. The fan module includes a housing configured to retain a fan and a motor to rotate the fan. The housing includes an air inlet aperture on an air inlet side of the housing and an air outlet aperture on an air outlet side of the housing. The fan system further includes an outlet fan guard coupled to the fan module on the air outlet side of the housing. The outlet fan guard includes at least one flap rotatable between a closed position, covering the air outlet aperture of the housing, and an open position, uncovering the air outlet aperture of the housing. The outlet fan guard further includes at least one spring urging the at least one flap into the closed position.

16 Claims, 7 Drawing Sheets

(56) References Cited

U.S. PATENT DOCUMENTS

| | | | | |
|---|---|---|---|---|
| 6,991,533 B2* | 1/2006 | Tsai | ............. | H05K 7/2019 361/695 |
| 7,025,086 B2* | 4/2006 | Maeda | ............. | F24F 13/15 137/512.1 |
| 7,345,875 B2* | 3/2008 | Elkins | ............. | H05K 7/20172 361/695 |
| 7,535,709 B2* | 5/2009 | Fan | ............. | G06F 1/20 174/16.3 |
| 7,952,870 B1* | 5/2011 | Zhou | ............. | G06F 1/20 165/122 |
| 8,057,161 B2* | 11/2011 | Seidler | ............. | F04D 29/703 415/26 |
| 8,414,368 B2* | 4/2013 | Hansen | ............. | F04D 25/14 454/351 |
| 8,601,740 B2* | 12/2013 | Tu | ............. | H05K 7/20181 49/92.1 |
| 8,747,056 B2* | 6/2014 | Nitta | ............. | G06F 1/20 415/201 |
| 8,770,925 B2* | 7/2014 | Liu | ............. | H05K 7/20181 415/148 |
| 9,157,536 B2* | 10/2015 | Li | ............. | F04D 25/14 |
| 11,089,713 B2* | 8/2021 | Escamilla | ............. | H05K 7/20181 |
| 11,224,142 B2* | 1/2022 | Chiu | ............. | H05K 7/20145 |
| 11,466,892 B2* | 10/2022 | Carey | ............. | F24F 13/1486 |
| 2007/0035924 A1* | 2/2007 | Westphall | ............. | G06F 1/183 361/679.48 |
| 2007/0064385 A1* | 3/2007 | Paul | ............. | G06F 1/187 361/679.48 |
| 2007/0134110 A1* | 6/2007 | Lin | ............. | H05K 7/20172 417/423.1 |
| 2008/0280552 A1* | 11/2008 | Baker | ............. | H05K 7/20172 454/259 |
| 2011/0116909 A1* | 5/2011 | Weisser | ............. | F04D 25/0613 415/126 |
| 2012/0138262 A1* | 6/2012 | Zhang | ............. | F04D 29/601 165/67 |
| 2013/0017076 A1* | 1/2013 | Li | ............. | H05K 7/20181 415/201 |
| 2013/0258590 A1* | 10/2013 | Sun | ............. | H05K 7/20172 361/695 |
| 2013/0320187 A1* | 12/2013 | Sun | ............. | H05K 7/20172 248/674 |
| 2013/0323044 A1* | 12/2013 | Sun | ............. | F04D 29/541 415/213.1 |
| 2015/0167691 A1* | 6/2015 | Chen | ............. | F04D 29/541 415/108 |
| 2018/0376614 A1* | 12/2018 | Xiong | ............. | F04D 25/0613 |
| 2020/0271128 A1* | 8/2020 | Chen | ............. | F04D 25/14 |
| 2021/0018011 A1* | 1/2021 | Lo | ............. | F04D 19/002 |
| 2021/0321532 A1* | 10/2021 | Yang | ............. | H05K 7/20172 |

* cited by examiner

FAN GUARD CONFIGURED TO SELECTIVELY COVER APERTURE

FIELD OF THE INVENTION

The present invention relates generally to a fan system within a computing system, and more specifically, to a fan system with reduced airflow resistance.

BACKGROUND OF THE INVENTION

Fan systems are abundant in computing systems for directing airflow through the computing systems. As cooling requirements have increased, so too have the rotating speeds of the fans within the fan systems. For example, the average rotating speed of a fan is up to 10,000 to 20,000 rotations per minute (rpm). With such high fan speeds, it can be highly dangerous when withdrawing and working with fans and fan systems without any protection, considering that the fans can keep rotating at high speeds even after the fans have been turned off. Thus, fan systems are required to have fan guards that prevent users from touching the rotating blades.

FIG. 1A shows a perspective view of an air outlet side 104 of a conventional fan system 100, and FIG. 1B shows a perspective view of an air inlet side 106 of the conventional fan system 100. The conventional fan system 100 includes a housing 102. Within the housing 102 is a fan (not shown). Within or on the exterior of the housing 102 is a motor (not shown) configured to rotate the fan (not shown) when powered on.

The air outlet side 104 includes a respective air outlet aperture 120, and the air inlet side 106 has a respective air inlet aperture 121. Coupled to the air outlet side 104 is a conventional outlet fan guard 108. Coupled to the air inlet side 106 is a conventional inlet fan guard 110. The conventional outlet fan guard 108 and the conventional inlet fan guard 110 limit a user's fingers from going within the housing 102 and potentially touching a spinning fan.

FIG. 2A shows a perspective view of an air outlet side 200 of the conventional outlet fan guard 108, and FIG. 2B shows a perspective view of an air inlet side 202 of the conventional outlet fan guard 108. The main purpose of the conventional outlet fan guard 108 is to prevent a user's finger from touching the rotating fan blades within the housing 102. However, considering airflow and fan efficiency, the conventional outlet fan guard 108, and indeed all conventional fan guards in general, is an obstacle that reduces airflow. Specifically, and referring to FIG. 2B, the conventional outlet fan guard 108 is formed of ribs 204 and 206 that span across an aperture 208 in the conventional outlet fan guard 108. The ribs 204 are radial ribs that generally extend radially outward within the aperture 208. The ribs 206 are circumferential ribs that generally follow the circumference the aperture 208, at varying radial distances. However, the ribs 204 and 206 can have various other designs that a configured to limit a user's fingers from entering the housing 102. Despite efforts to reduce the restriction caused by the ribs 204 and 206, the ribs 204 and 206 still restrict airflow through the aperture 208. No matter how the rib 204 and 206 designs are optimized, the ribs 204 and 206 still increase the air resistance compared to the aperture 208 with none of the ribs 204 and 206. Thus, a tradeoff with safety is thermal efficiency in fan guard design.

The present disclosure is directed to solving the above problems found in conventional fan guards, such as the conventional outlet fan guard 108, by reducing or removing obstacles that would otherwise reduce airflow.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, a fan system is disclosed. The fan system includes a fan module. The fan module includes a housing configured to retain a fan and a motor to rotate the fan. The housing includes an air inlet aperture on an air inlet side of the housing and an air outlet aperture on an air outlet side of the housing. The fan system further includes an outlet fan guard coupled to the fan module on the air outlet side of the housing. The outlet fan guard includes at least one flap rotatable between a closed position, covering the air outlet aperture of the housing, and an open position, uncovering the air outlet aperture of the housing. The outlet fan guard further includes at least one spring urging the at least one flap into the closed position.

According to one aspect of the above embodiment, the at least one flap includes a pair of flaps that are configured to open outward, away from the fan module, and the at least one spring includes a pair of springs, with each flap of the pair of flaps being coupled to a separate spring of the pair of springs. According to another aspect of the above embodiment, the at least one flap rotates at least about 90 degrees between the closed position and the open position. According to another aspect of the above embodiment, the at least one flap is formed of a solid material such that air cannot pass through the at least one flap. According to another aspect of the above embodiment, the at least one flap is formed of a plurality of ribs such that air can pass through the at least one flap. According to another aspect of the above embodiment, the outlet fan guard includes a frame configured to couple the outlet fan guard to the fan module. According to the aspect of the above embodiment, the frame includes a pin, and the at least one flap is configured to couple to the frame by the pin such that the at least one flap can rotate around the pin. According to another aspect of the above embodiment, the fan system is configured to be retained within a chassis of a computing system, and the at least one flap includes a flange that abuts a projection on the chassis to cause the at least one flap to rotate from the closed position to the open position during insertion of the fan system into the chassis and maintain the at least one flap in the open position with the fan system retained within the chassis. According to another aspect of the above embodiment, the fan system further includes an inlet fan guard coupled to the fan module on the air inlet side of the housing. According to this aspect of the above embodiment, the inlet fan guard includes a handle for removing the fan system from within a chassis of a computing system.

According to another embodiment of the present disclosure, a computing system is disclosed. The computing system includes a fan system. The fan system includes a fan module. The fan module includes a housing configured to retain a fan and a motor to rotate the fan. The housing includes an air inlet aperture on an air inlet side of the housing and an air outlet aperture on an air outlet side of the housing. The fan system further includes an outlet fan guard coupled to the fan module on the air outlet side of the housing. The outlet fan guard includes at least one flap configured to rotate between a closed position, covering the air outlet aperture of the housing, and an open position, uncovering the air outlet aperture of the housing. The outlet fan guard further includes at least one spring configured to urge the at least one flap into the closed position. The fan system further includes a chassis. The chassis includes a fan cage configured to retain the fan system.

According to one aspect of the above embodiment, the fan cage includes a projection. The at least one flap includes a flange. The projection is configured to cause the at least one flap to rotate from the closed position to the open position during insertion of the fan system into the fan cage, and maintain the at least one flap in the open position with the fan system retained within the fan cage. According to another aspect of the above embodiment, the fan cage is configured to retain a plurality of the fan system. According to another aspect of the above embodiment, the at least one flap includes a pair of flaps that are configured to open outward, away from the fan module, and the at least one spring includes a pair of springs, with each flap of the pair of flaps being coupled to a separate spring of the pair of springs. According to another aspect of the above embodiment, the at least one flap rotates at least about 90 degrees between the closed position and the open position. According to another aspect of the above embodiment, the at least one flap is solid. According to another aspect of the above embodiment, the at least one flap is formed of a plurality of ribs such that air can pass through the at least one flap. According to another aspect of the above embodiment, the outlet fan guard includes a frame configured to couple the outlet fan guard to the fan module. According to another aspect of the above embodiment, the frame includes a pin, and the at least one flap is configured to couple to the frame by the pin such that the at least one flap can rotate around the pin. According to another aspect of the above embodiment, the computing system further includes an inlet fan guard coupled to the fan module on the air inlet side of the housing. The inlet fan guard includes a handle for removing the fan system from within the fan cage.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1A:
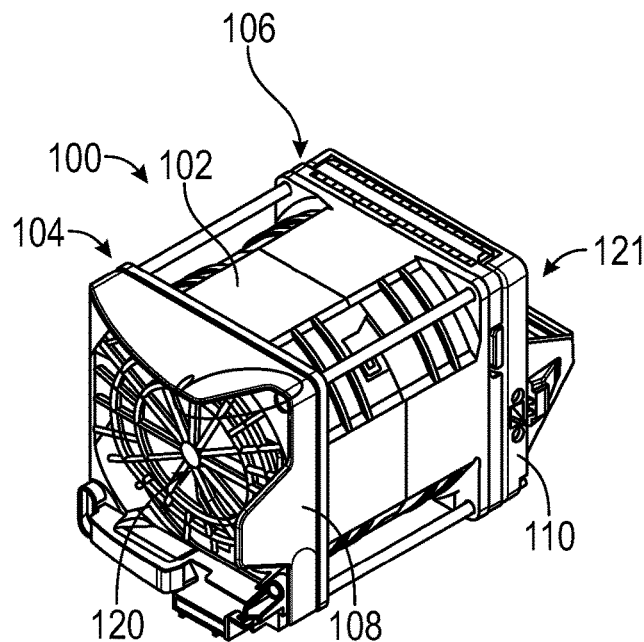
FIG. 1A shows a perspective view of an air outlet side of a conventional fan system.
Figure 1B:
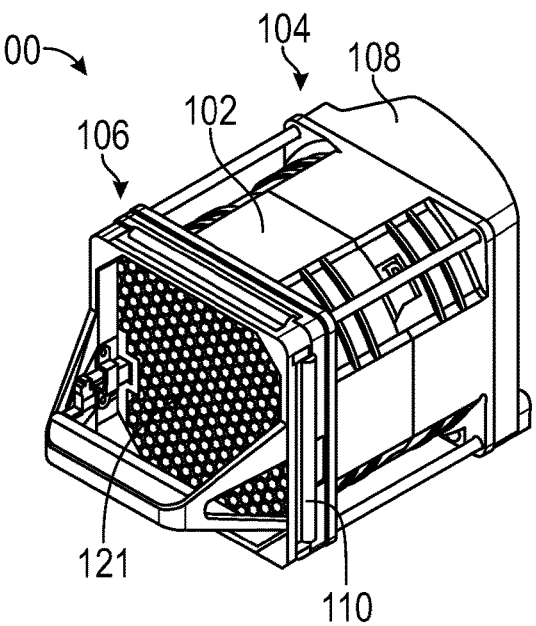
FIG. 1B shows a perspective view of an air inlet side of a conventional fan system.
Figure 2A:
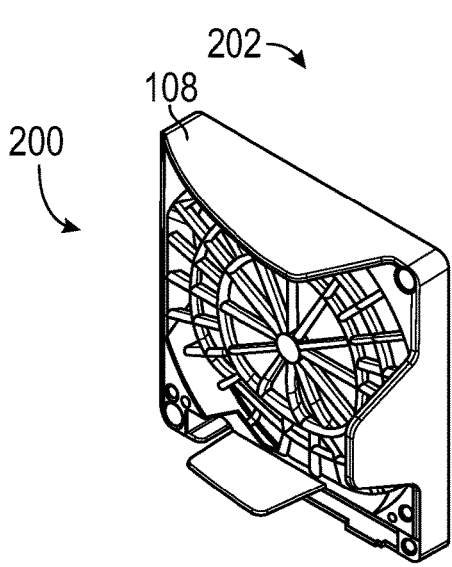
FIG. 2A shows a perspective view of an air outlet side of a conventional outlet fan guard.
Figure 2B:
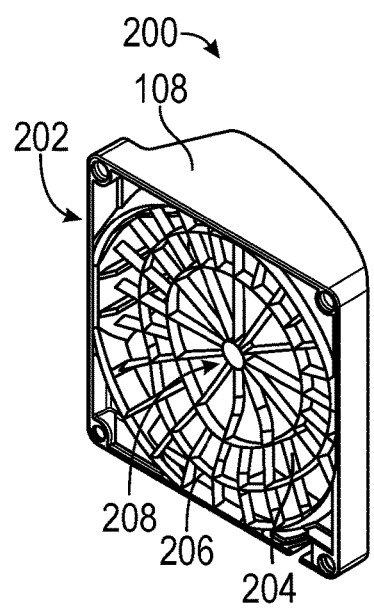
FIG. 2B shows a perspective view of an air inlet side of a conventional outlet fan guard.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

Figure 3:
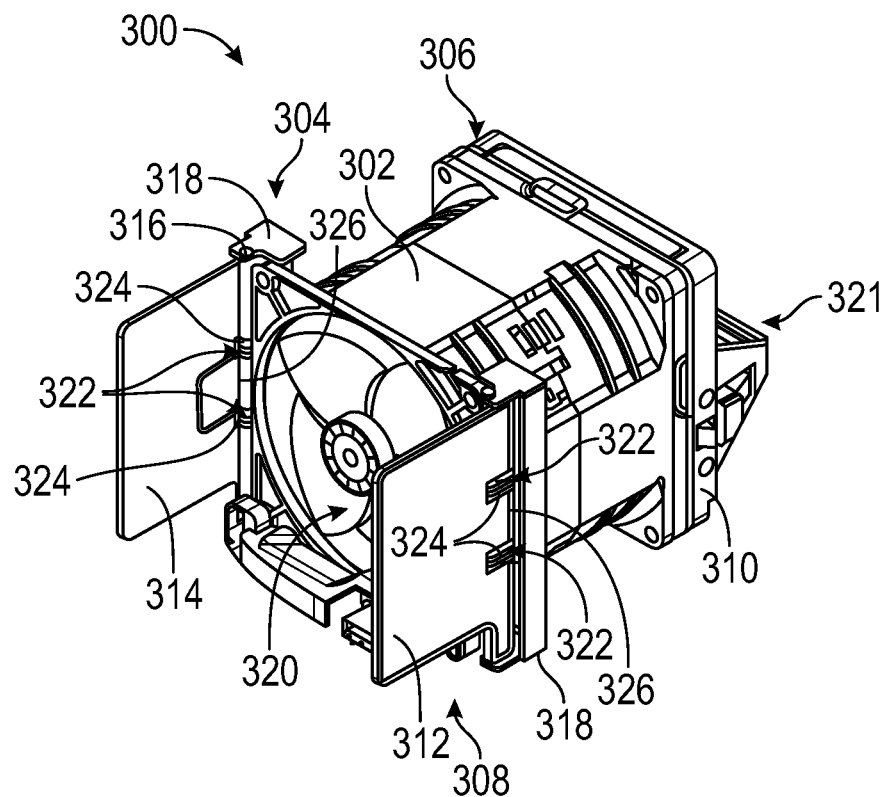
FIG. 3 shows a perspective view of a fan system, according to an aspect of the present disclosure.

FIG. 3 shows a perspective view of a fan system 300, according to an aspect of the present disclosure. The fan system 300 includes a housing 302. Within the housing 302 is a fan (not shown). Within or on the exterior of the housing 302 is a motor (not shown) configured to rotate the fan (not shown) when powered on.

The housing 302 has an air outlet side 304, with a respective air outlet aperture 320, and an air inlet side 306, with a respective air inlet aperture 321. Coupled to the air outlet side 304 is an outlet fan guard 308. Coupled to the air inlet side 306 is a conventional inlet fan guard 310. The inlet fan guard 310 prevents a user's fingers from going within the housing 302 and potentially contacting the fan when the fan is spinning.

Figure 5:
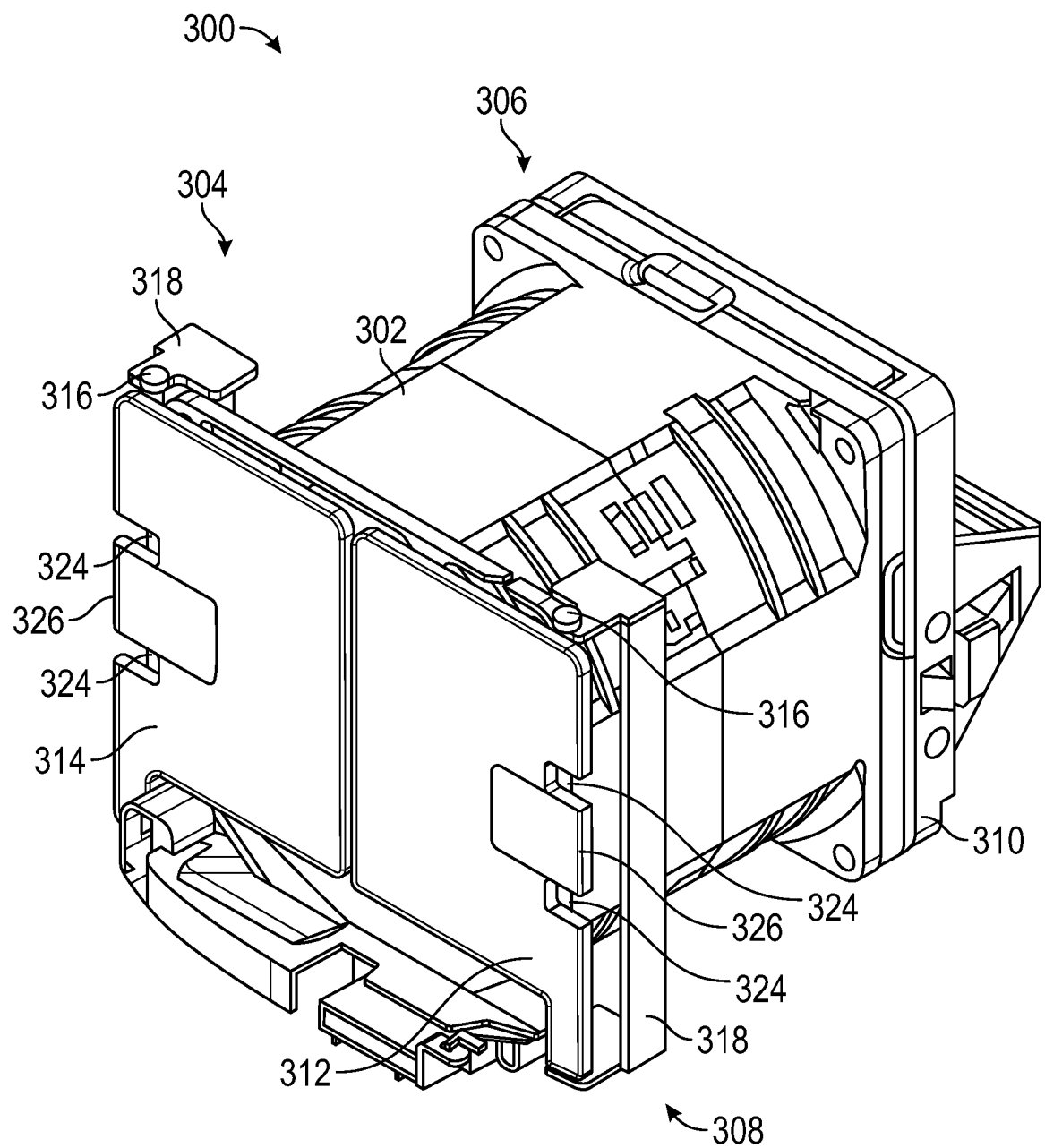
FIG. 5 shows a perspective view of a fan system with the flaps in a closed position, according to an aspect of the present disclosure.

Unlike the conventional outlet fan guard 108 in FIGS. 1A-2B, the outlet fan guard 308 includes two flaps 312 and 314. The flaps 312 and 314 are solid such that air and, more importantly, fingers cannot pass through the flaps 312 and 314. The flaps 312 and 314 are connected via pins 316 to a frame 318. The flaps 312 and 314 are configured to rotate about the pins 316 relative to the frame 318 between an open position, as shown in FIG. 3, and a closed position, as shown in FIG. 5.

The frame 318 is coupled to the air outlet side 304 of the housing 302. In the open position, as shown in FIG. 3, the flaps 312 and 314 uncover or do not block the air outlet aperture 320 of the housing 302.

Each one of the flaps 312 and 314 includes one or more cutouts 322. The cutouts 322 allow one or more springs 324 to be retained on the pins 316 and be in contact with the flaps 312 and 314. The springs 324 in contact with the flaps 312 and 314 urge the flaps 312 and 314 into the open position, as shown in FIG. 3.

The cutouts 322 also define flanges 326. In one or more embodiments, the flanges 326 are configured to abut a projection on a chassis in which the fan system 300 is configured to be retained within. As discussed further below with respect to FIGS. 6 and 7, the projections abutting the flanges 326 cause the flaps 312 and 314 to rotate from the closed position (FIG. 5) to the open position (FIG. 3) during insertion of the fan system 300 into a chassis. With the fan system 300 inserted into a chassis, the flanges 326 abutting the projections maintain the flaps 312 and 314 in the open position.

Figure 4:
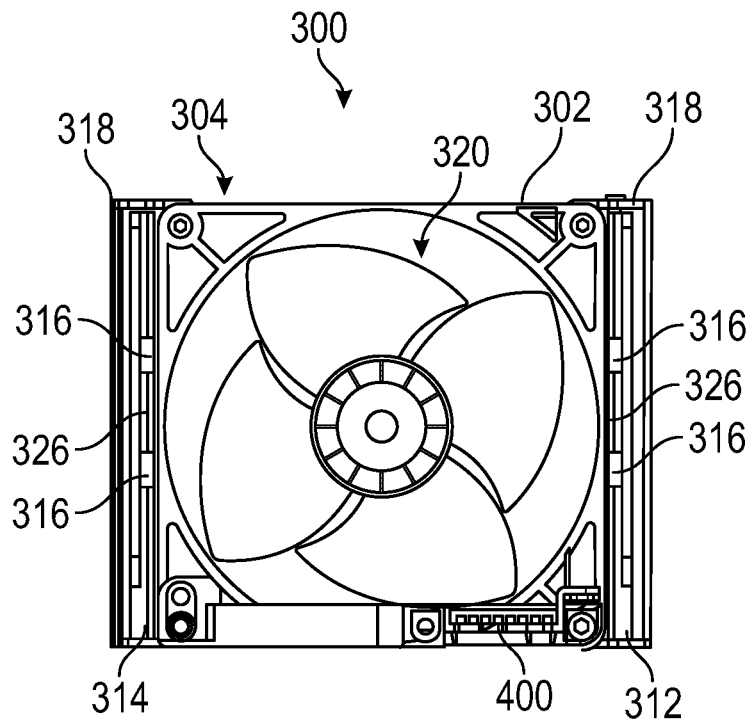
FIG. 4 shows a side view of an air outlet side of a fan system, according to an aspect of the present disclosure.

FIG. 4 shows a side view of the air outlet side 304 of the fan system 300, according to an aspect of the present disclosure. The flaps 312 and 314 are on opposite sides of the air outlet side 304 of the housing 302. The pins 316 are seen through the cutouts 322 of the flaps 312 and 314. As discussed above, the pins 316 connect the flaps 312 and 314 to the frame 318.

The housing 302 further includes a connector 400. When inserted into a fan cage within a chassis of a computing system (FIG. 6), the connector 400 connects to a corresponding connector within the computing system to deliver power to the fan system 300.

Although two flaps 312 and 314 are shown, alternatively, there can be a single flap that covers the entire air outlet aperture 320 when closed. The single flap can extend across the air outlet aperture 320 from the position of the flap 312 or from the position of the flap 314. Alternatively, the single flap can be oriented horizontally across the housing 302 and swing down to cover the air outlet aperture 320. With a single flap there can likewise be a single spring.

FIG. 5 shows a perspective view of the fan system 300 with the flaps 312 and 314 in a closed position, according to an aspect of the present disclosure. The flaps 312 and 314 in the closed position cover the air outlet aperture 320 (FIGS. 3 and 4) of the housing 302. The flaps 312 and 314 rotate about 90 degrees into the closed position of FIG. 5 when the fan system 300 is withdrawn from a chassis of a computing system as the springs 324 urge the flaps 312 and 314 closed. Thus, the flaps 312 and 314 prevent a user's fingers from entering the housing 302 with the fan system 300 withdrawn from the chassis.

Figure 6:
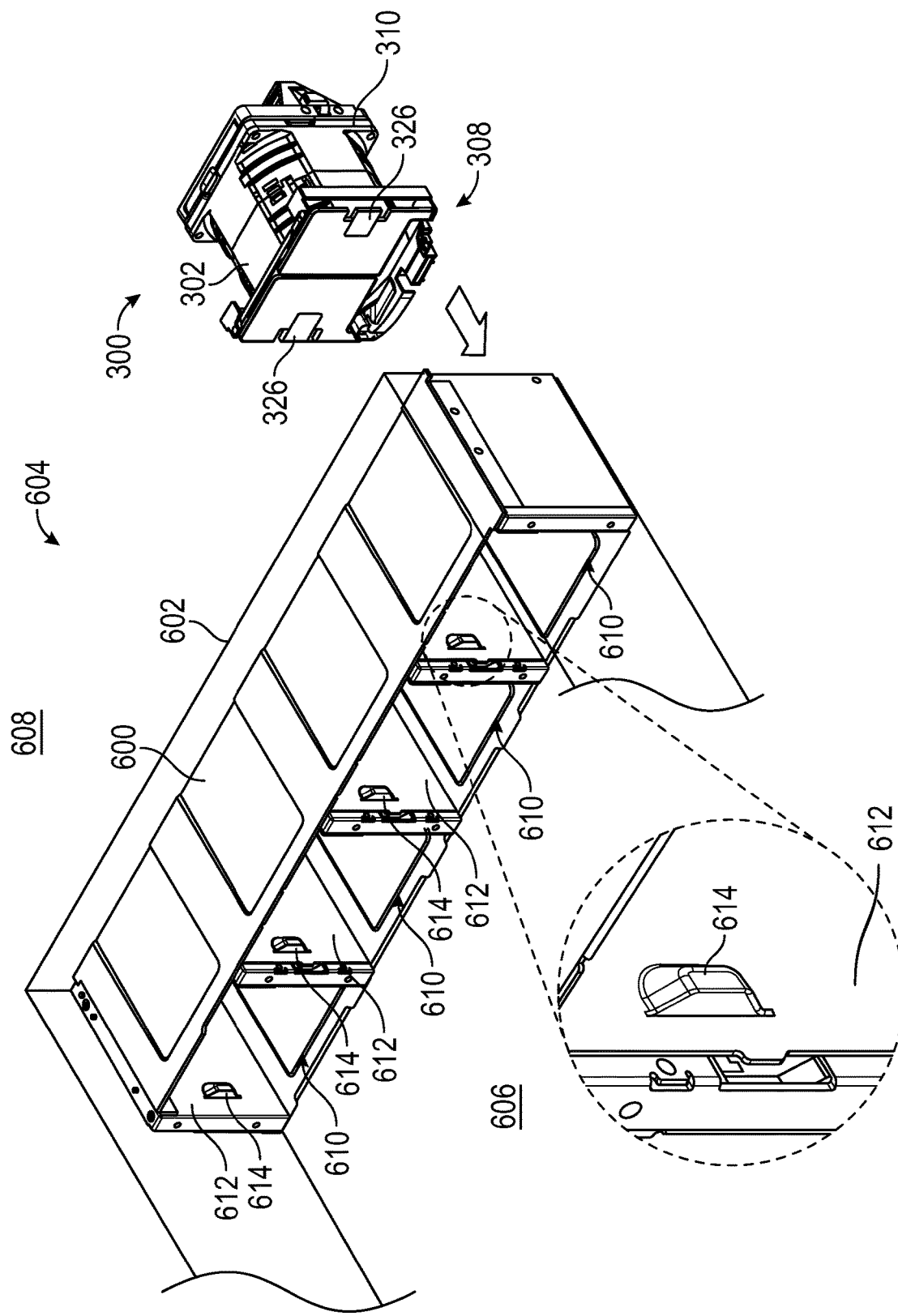
FIG. 6 shows a perspective view of a fan system being inserted into a fan cage, according to an aspect of the present disclosure.

FIG. 6 shows a perspective view of the fan system 300 being inserted into a fan cage 600, according to an aspect of the present disclosure. As discussed above, the fan cage 600 is retained in a chassis 602 of a computing system 604. The computing system 604 can be, for example, a server computing system, and the chassis 602 can be, for example, a server rack. The fan system 300 is inserted into the fan cage 600 such that the outlet fan guard 308 is facing the inside 606 of the chassis 602, and the inlet fan guard 310 is facing the outside 608 of the chassis 602. Thus, with the fan system 300 inside the fan cage 600, and the outlet fan guard 308 facing the inside 606 of the chassis 602, the risk of a user inserting a finger inside the housing 302 of the fan system 300 is minimal because other components within the chassis 602 block access to inside the housing 302.

The fan cage 600 can include multiple fan bays 610, and each fan bay 610 can be configured to retain a fan system 300. As shown throughout FIG. 6, but also more specifically in the detailed view, inner walls 612 of the fan bays 610 of the fan cage 600 include projections 614. The projections 614 are configured to abut the flanges 326 on the flaps 312 and 314 of the fan system 300 to cause the flaps 312 and 314 to open as the fan system 300 is inserted into the fan cage 600, as discussed further below.

Figure 7:
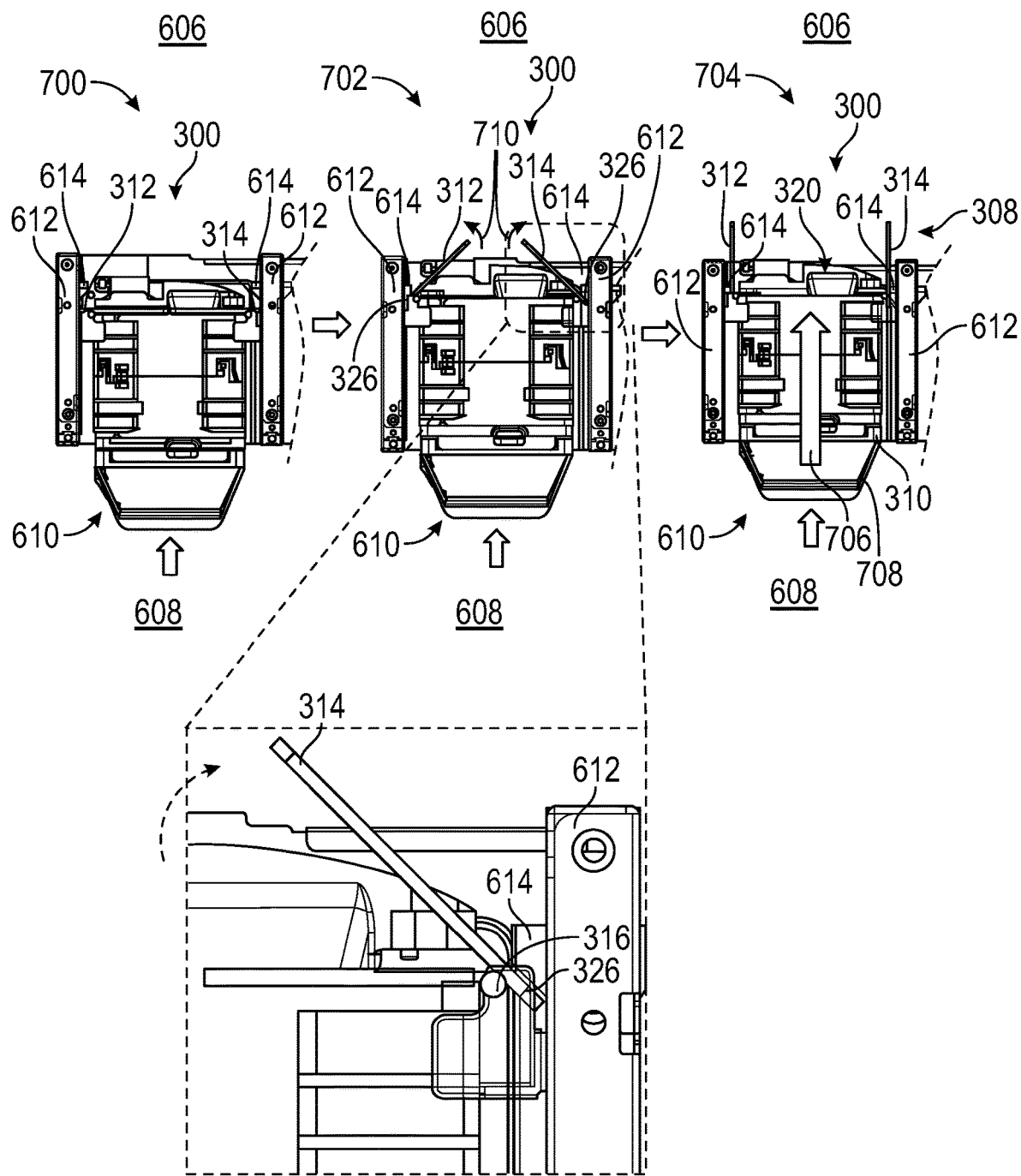
FIG. 7 shows partial cross-sectional views of steps for inserting a fan system into a fan cage, according to an aspect of the present disclosure.

FIG. 7 shows partial cross-sectional views of steps for inserting the fan system 300 into the fan cage 600, according to an aspect of the present disclosure. Beginning with the left view 700 in FIG. 7, the fan system 300 is inserted into the fan bay 610.

Next, as the fan system 300 is inserted farther into the fan bay 610, the center view 702 shows that the flanges 326 abut the projections 614. As shown in the detailed view, the flaps 312 and 314 begin to rotate outward from the fan system 300, in the direction of arrows 710, based on the flanges 326 abutting the projections 614. The flaps 312 and 314 rotate about the pins 316.

Next, as shown in the right view 704, when the fan system 300 is fully inserted into the fan bay 610, the projections 614 cause the flaps 312 and 314 to be in the open position (FIGS. 3 and 4). In the open position, the flaps 312 and 314 have generally rotated about 90 degrees outward from the fan system 300 in the direction of arrows 710. The flaps 312 and 314 in the open position uncover the air outlet aperture 320 of the fan system 300. The uncovered air outlet aperture 320 allows airflow, represented by the arrow 706, to pass through the fan system 300 without the outlet fan guard 308 obstructing the airflow 706. Thus, the performance of the fan system 300 is improved as compared to, for example, the conventional fan system 100 of FIGS. 1A and 1B, which includes the conventional outlet fan guard 108 that obstructs airflow.

As shown in the right view 704, the fan system 300 includes the air inlet fan guard 310, which faces the outside 608 of the chassis 602. The air inlet fan guard 310 includes a handle 708. When in use, the handle 708 allows a user to withdraw the fan system 300 from the fan bay 610. When not in use, the handle 708 folds out of the way so as to not obstruct the airflow 706 through the air inlet fan guard 310. Withdrawing the fan system 300 from the fan bay 610 reverses the steps shown in FIG. 7, beginning with the right view 704 and proceeding left to the left view 700.

Figure 8:
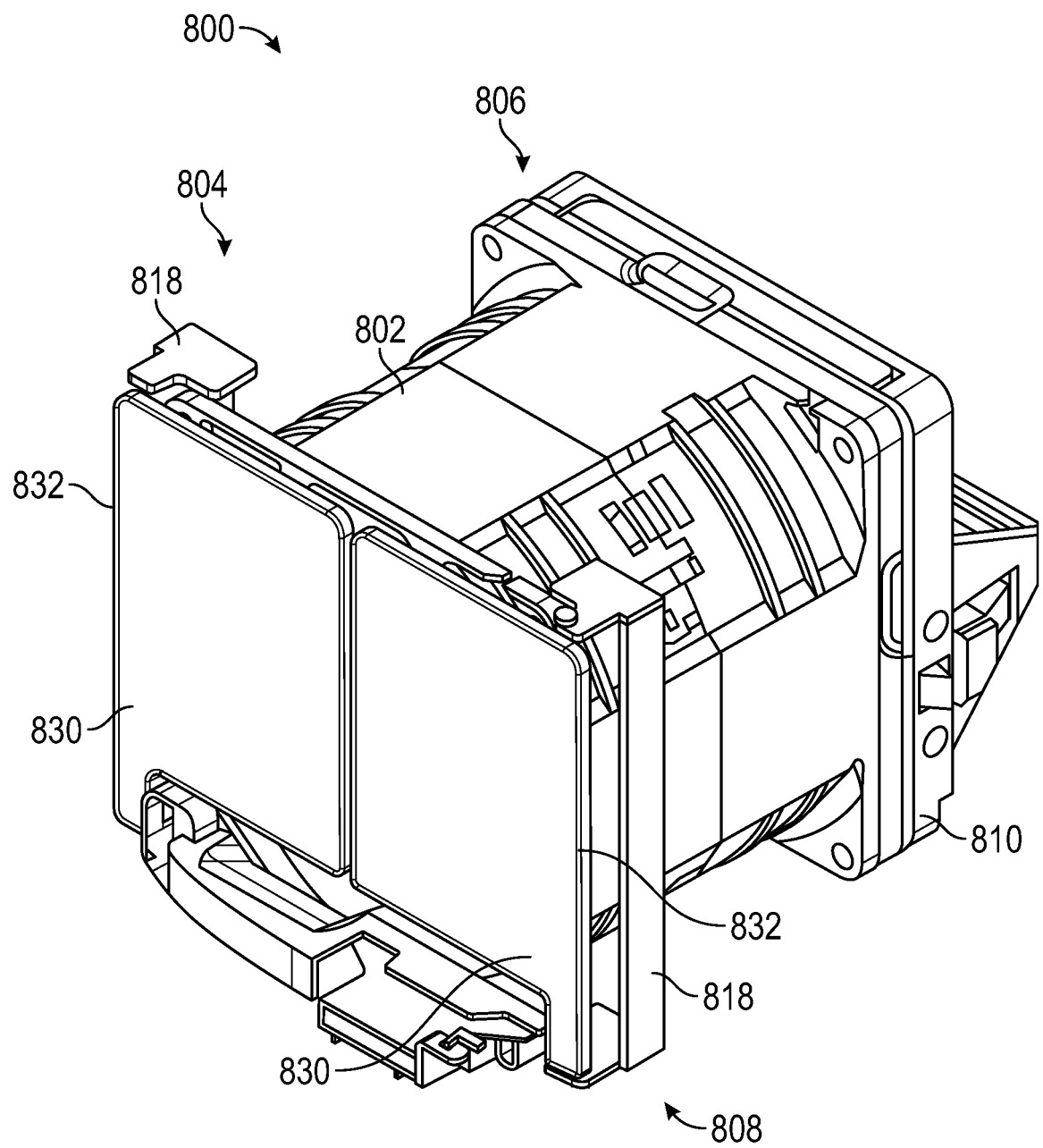
FIG. 8 shows a perspective view of an alternative fan system, according to an aspect of the present disclosure.

FIG. 8 shows a perspective view of an alternative fan system 800, according to an aspect of the present disclosure. The fan system 800 is similar to the fan system 300. Thus, the same description as provided above applies to the elements of the fan system 800, where element numbers end in the same tens and ones digits as the element numbers for the fan system 300, except as otherwise described. Namely, the fan system 800 includes a pair of flaps 830 that do not contain cutouts (cutouts 322, FIG. 3) or flanges (flanges 326, FIG. 3) as the flaps 312 and 314 have described above. Instead, the outer edges 832 of the flaps 830 are configured to abut a projection (projection 614, FIG. 6) in a fan cage (fan cage 600, FIG. 6) directly. Further, the flaps 830 can be directly connected to the frame 818, instead of requiring pins (pins 316, FIG. 3). Springs can be embedded within the flaps 830 or the frame 818 for urging the flaps 830 into the closed position.

Figure 9:
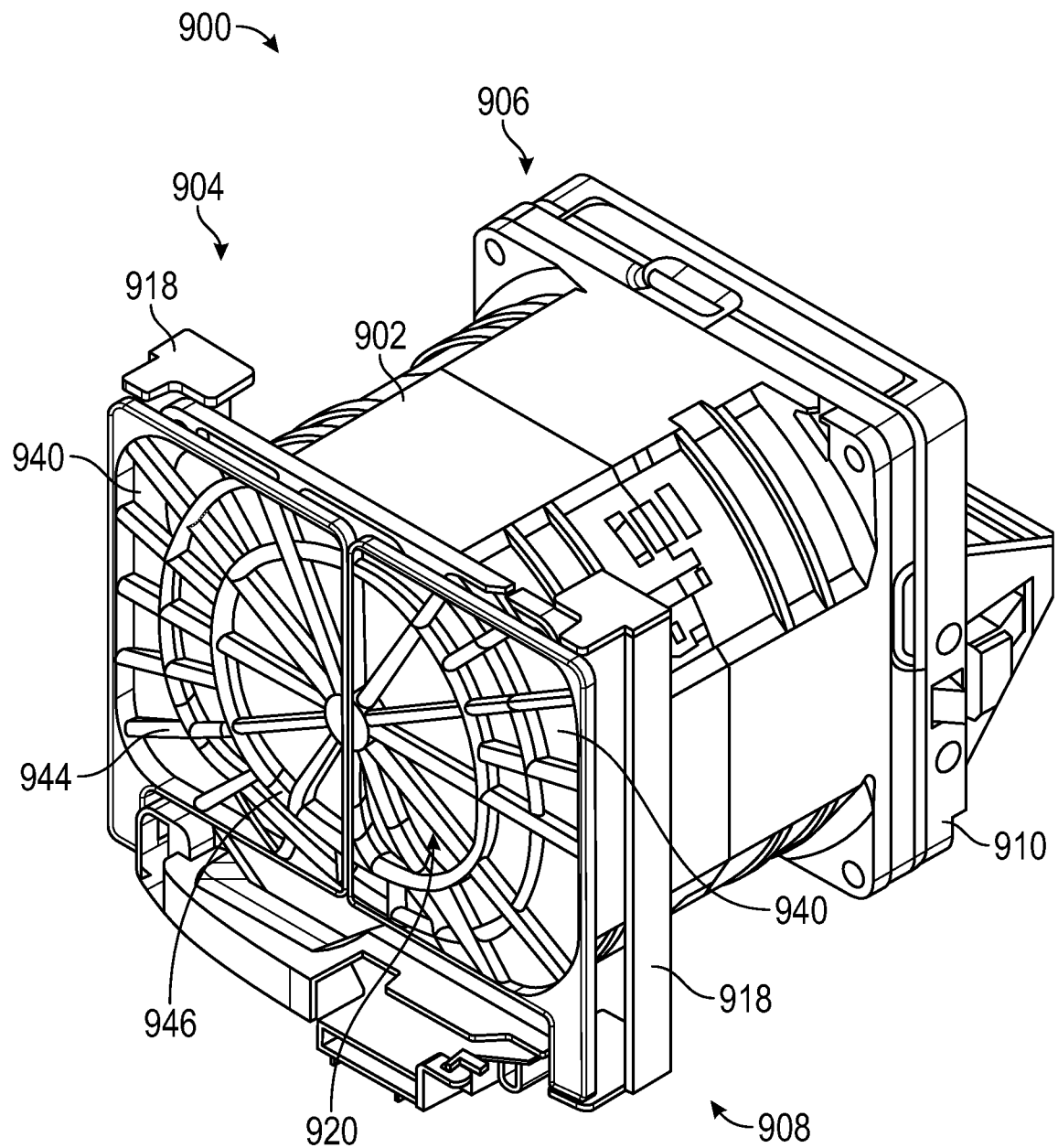
FIG. 9 shows a perspective view of an alternative fan system, according to an aspect of the present disclosure.

FIG. 9 shows a perspective view of an alternative fan system 900, according to an aspect of the present disclosure. The fan system 900 is similar to the fan systems 300 and 800. Thus, the same description as provided above applies to the elements of the fan system 900, where element numbers end in the same tens and ones digits as the element numbers for the fan system 300, except as otherwise described. The flaps 940 for the fan system 900 are configured to rotate like the flaps 312 and 314 of the fan system 300. Thus, FIG. 9 shows the flaps 940 in the closed position. In the open position, the flaps 940 rotate to uncover the air outlet aperture 920. However, the flaps 940 are formed of a plurality of ribs 944 and 946 such that air can pass through the flaps 940. The ribs 944 and 946 are similar to the ribs 204 and 206, respectively, of FIG. 2B. Yet, because the ribs 944 and 946 are on the flaps 940, the ribs 944 and 946 do not obstruct airflow through the air outlet aperture 920 when the fan system 900 is in use within a fan cage (fan cage 600, FIG. 6). Instead, the flaps 940 rotate open such that the ribs 944 and 946 do not obstruct airflow through the air outlet aperture 920.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A fan system comprising:
 a fan module including:
  a housing configured to retain a fan and a motor to rotate the fan, the housing including:
   an air inlet aperture on an air inlet side of the housing; and
   an air outlet aperture on an air outlet side of the housing; and
  an outlet fan guard coupled to the fan module on the air outlet side of the housing, the outlet fan guard including:
   at least one flap rotatable between a closed position, covering the air outlet aperture of the housing, and an open position, uncovering the air outlet aperture of the housing; and
   at least one spring urging the at least one flap into the closed position,
   wherein the at least one flap is formed of a plurality of ribs such that air can pass through the at least one flap.

2. The fan system of claim 1, wherein the at least one flap includes a pair of flaps that are configured to open outward, away from the fan module, and the at least one spring includes a pair of springs, with each flap of the pair of flaps being coupled to a separate spring of the pair of springs.

3. The fan system of claim 1, wherein the at least one flap rotates at least about 90 degrees between the closed position and the open position.

4. The fan system of claim 1, wherein the outlet fan guard includes a frame configured to couple the outlet fan guard to the fan module.

5. The fan system of claim 4, wherein the frame includes a pin, and the at least one flap is configured to couple to the frame by the pin such that the at least one flap can rotate around the pin.

6. The fan system of claim 1, wherein the fan system is configured to be retained within a chassis of a computing system, and the at least one flap includes a flange that abuts a projection on the chassis to:

cause the at least one flap to rotate from the closed position to the open position during insertion of the fan system into the chassis; and maintain the at least one flap in the open position with the fan system retained within the chassis.

7. The fan system of claim 1, further comprising:
an inlet fan guard coupled to the fan module on the air inlet side of the housing.

8. The fan system of claim 7, wherein the inlet fan guard includes a handle for removing the fan system from within a chassis of a computing system.

9. A computing system comprising:
a fan system including:
a fan module including:
a housing configured to retain a fan and a motor to rotate the fan, the housing including:
an air inlet aperture on an air inlet side of the housing; and
an air outlet aperture on an air outlet side of the housing; and
an outlet fan guard coupled to the fan module on the air outlet side of the housing, the outlet fan guard including:
at least one flap rotatable between a closed position, covering the air outlet aperture of the housing, and an open position, uncovering the air outlet aperture of the housing; and
at least one spring urging the at least one flap into the closed position; and
a chassis including a fan cage configured to retain the fan system,
wherein the at least one flap is formed of a plurality of ribs such that air can pass through the at least one flap.

10. The computing system of claim 9, wherein the fan cage includes a projection, the at least one flap includes a flange, and the projection is configured to cause the at least one flap to:
rotate from the closed position to the open position during insertion of the fan system into the fan cage; and
maintain the at least one flap in the open position with the fan system retained within the fan cage.

11. The computing system of claim 9, wherein the fan cage is configured to retain a plurality of the fan system.

12. The computing system of claim 9, wherein the at least one flap includes a pair of flaps that are configured to open outward, away from the fan module, and the at least one spring includes a pair of springs, with each flap of the pair of flaps being coupled to a separate spring of the pair of springs.

13. The computing system of claim 9, wherein the at least one flap rotates at least about 90 degrees between the closed position and the open position.

14. The computing system of claim 9, wherein the outlet fan guard includes a frame configured to couple the outlet fan guard to the fan module.

15. The computing system of claim 14, wherein the frame includes a pin, and the at least one flap is configured to couple to the frame by the pin such that the at least one flap can rotate around the pin.

16. The computing system of claim 9, further comprising:
an inlet fan guard coupled to the fan module on the air inlet side of the housing,
wherein the inlet fan guard includes a handle for removing the fan system from within the fan cage.

* * * * *